(12) United States Patent
Lee (10) Patent No.: US 7,558,121 B2
(45) Date of Patent: Jul. 7, 2009

(54) FLASH MEMORY DEVICE AND SMART CARD INCLUDING THE SAME

(75) Inventor: Byeong-Hoon Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 138 days.

(21) Appl. No.: 11/694,473

(22) Filed: Mar. 30, 2007

(65) Prior Publication Data
US 2008/0117674 A1 May 22, 2008

(30) Foreign Application Priority Data
Nov. 21, 2006 (KR) .................. 10-2006-0115392

(51) Int. Cl.
*G11C 11/34* (2006.01)
(52) U.S. Cl. .................. 365/185.33; 365/185.2; 365/185.21
(58) Field of Classification Search .......... 365/185.2, 365/185.33, 185.21, 195, 196, 198, 200, 365/189.05
See application file for complete search history.

(56) References Cited

U.S. PATENT DOCUMENTS

| 4,932,053 | A | 6/1990 | Fruhauf et al. | |
| 6,698,662 | B1 | 3/2004 | Feyt et al. | |
| 2003/0218914 | A1* | 11/2003 | Kim et al. | 365/189.05 |
| 2004/0208056 | A9* | 10/2004 | Sim et al. | 365/185.2 |
| 2005/0146981 | A1* | 7/2005 | Ahn | 365/233 |
| 2005/0152177 | A1* | 7/2005 | McClure | 365/154 |
| 2006/0176597 | A1* | 8/2006 | Ngo et al. | 360/46 |
| 2007/0263453 | A1* | 11/2007 | Tanzawa | 365/185.23 |

FOREIGN PATENT DOCUMENTS

| JP | 20040326648 | 11/2004 |
| KR | 1020000020101 | 4/2000 |
| KR | 1020020046320 | 6/2002 |
| KR | 1020020046321 | 6/2002 |
| KR | 1020060059548 | 6/2006 |
| KR | 1020060095655 | 9/2006 |

OTHER PUBLICATIONS

English Abstract for Publication No. 20040326648, Nov. 18, 2004.

(Continued)

*Primary Examiner*—Dang T Nguyen
(74) *Attorney, Agent, or Firm*—F. Chau & Associates, LLC (57) ABSTRACT

A flash memory device includes an array having memory cells arranged in rows and columns. A high voltage generator is configured to supply a high voltage to the array during a programming operation. Write buffers corresponding to selected memory cells drive the selected memory cells with a program voltage or a program-inhibition voltage in response to input data. Each write buffer consumes a dummy cell current when input data is program-inhibited data. A current-voltage conversion circuit connected to the write buffers through a common sensing line supplies a current to the write buffers as the dummy cell current through the common sensing line and outputs a voltage proportional to the current, supplied to the write buffers. A current sink circuit discharges a current from an output of the high voltage generator in response to a voltage output from the current-voltage conversion circuit.

8 Claims, 8 Drawing Sheets

OTHER PUBLICATIONS

English Abstract for Publication No. 1020000020101, Apr. 15, 2000.
English Abstract for Publication No. 1020020046321, Jun. 21, 2002.
English Abstract for Publication No. 1020020046320, Jun. 21, 2002.
English Abstract for Publication No. 1020060095655, Sep. 1, 2006.

* cited by examiner

FLASH MEMORY DEVICE AND SMART CARD INCLUDING THE SAME

CROSS-REFERENCE TO RELATED APPLICATION

This application claims priority under 35 U.S.C, 119 to Korean Patent Application No. 10-2006-0115392, filed on Nov. 21, 2006, the entire contents of which are hereby incorporated by reference.

BACKGROUND OF THE INVENTION

1. Technical Field

The present disclosure relates to flash memory, and more particularly, to a flash memory device and a smart card including the same.

2. Discussion of the Related Art

Semiconductor memory devices are generally classified as volatile or nonvolatile according to whether memory can be retained in the absence of power. Random access memories such as SRAM and DRAM are typically volatile memory devices. Nonvolatile memory devices include read-only memories (ROMs), e.g., erasable and programmable ROMs (EPROMs), electrically erasable and programmable ROMs (EEPROMs), and flash memories.

Modern flash memory devices have small size, low power consumption, and advanced reading/writing performance. For example, flash memory devices are usually employed in providing on-chip memory system for portable apparatuses such as cellular phones, digital cameras, audio/video recorders, modems, smart cards, and so forth. Such portable apparatuses require quick access to data. For example, in smart cards that must be secured against unauthorized access. Modern intrusion and authentication circumvention techniques may be used to monitor internal operation of smart cards by detecting consumption and variation of currents and electromagnetic fields that are present during internal activation. Accordingly, security features may be added to smart cards to protect against the monitoring of currents and electromagnetic fields within the smart card.

A flash memory cell, e.g., a split-gate flash memory cell uses F-N tunneling for erasing data thereof and source-side channel hot electron injection for programming data therein. To program a memory cell using source-side channel hot electron injection, a word line of the selected memory cell is driven with a voltage about 1.2V and a source line of the selected memory cell is driven with a voltage about 9V. For data to be programmed (program data), a bit line of the selected memory cell may be driven with a voltage about 0.3V. Accordingly, current is consumed as it flows from the bit line to the source line through the selected memory cell. For data to be inhibited against programming (program-inhibited data), a bit line of a selected memory cell may be driven by a power source voltage turning off the selected memory cell to interrupt a current to the hit line from the source line.

As discussed above, in a secure integrated circuit card equipped with a flash memory device having flash memory cells, high voltages over a power source voltage are normally used for writing or erasing specific information. A high voltage generator for generating high voltages is usually inefficient and an amount of current dissipated during a programming operation may depend upon the number of data bits to be programmed. For example, an amount of current dissipated in simultaneously programming 32 memory cells may differ from the amount of current dissipated in simultaneously programming 16 memory cells. Because of this, there may be an observable drop in current consumption as memory cells are accessed. This observable drop in current consumption may be a security vulnerability.

SUMMARY OF THE INVENTION

Exemplary embodiments of the present invention are directed to a flash memory device capable of maintaining a constant level of current consumption regardless of the number of data bits to be programmed, and a smart card including the same.

An exemplary embodiment of the present invention relates to a flash memory device including an array having memory cells arranged in rows and columns. A high voltage generator generates a high voltage and supplies the array during a programming operation. Write buffers corresponding to selected memory cells drive the selected memory cells with a program voltage or a program-inhibition voltage in response to input data. Each write buffer consumes a dummy cell current when input data is program-inhibited data. A current-voltage conversion circuit, connected in common to the write buffers through a common sensing line, supplies a current to the write buffers as the dummy cell current through the common sensing line and outputs a voltage proportional to the current supplied to the write buffers. A current sink circuit discharges a current from an output of the high voltage generator in response to a voltage output from the current-voltage conversion circuit, In an exemplary embodiment, each write buffer includes a drive circuit configured to drive a corresponding memory cell in response to corresponding input data during the programming operation. A current sink; discharges the dummy cell current from the common sensing line in response to the corresponding input data during the programming operation.

In an exemplary embodiment, the dummy cell current consumed through the current sink of the write buffer corresponds to a cell current consumed through a unit memory cell during the programming operation.

In an exemplary embodiment, the current-voltage conversion circuit supplies a current to the common sensing line to provide for current consumed while programming all of the selected memory cells.

In an exemplary embodiment, a sum of an amount of current consumed while programming the selected memory cells and an amount of current consumed by the write buffers is constant regardless of the number of program data bits in the input data An exemplary embodiment of the present invention also provides a method of programming a flash memory device including an array having memory cells arranged in rows and columns. A high voltage generator generates a high voltage to supply the array during a programming operation. Write buffers are configured to drive the selected memory cells with a program voltage or a program-inhibition voltage in response to input data. The method includes driving the selected memory cells with the program voltage or the program-inhibition voltage in response to the input data. A dummy cell current is consumed through each write buffer when the input data is program-inhibited data. A voltage proportional to a current supplied to the write buffers is output through a common sensing line shared by the write buffers as the dummy cell current. A current from an output of the high voltage generator is discharged in response to a voltage proportional to the current supplied to the write buffers.

In an exemplary embodiment, a sum of an amount of current consumed while programming the selected memory cells and an amount of current consumed by the write buffers is constant regardless of the number of program data bits in the input data.

Another exemplary embodiment of the present invention relates to a flash memory device including an array having memory cells arranged in rows and columns. A pump circuit generates a pumping voltage. A regulator adjusts the pumping voltage and generates a high voltage to be supplied into the array. A current sink circuit detects an amount of cell current consumed by selected memory cells during a programming operation in accordance with reduction of the high voltage. The current sink discharges a dummy cell current from an output of the pump circuit to equalize any difference between the detect cell current and the maximum cell current.

In an exemplary embodiment, the maximum cell current corresponds to an amount of current consumed while programming all of the selected memory cells.

In an exemplary embodiment, the current sink circuit discharges the dummy cell current from the output of the pump circuit regardless of data to be programmed in the array.

In an exemplary embodiment, the current sink circuit includes a consuming-current detector detecting the amount of cell current consumed during the programming operation in response to the reduction of the high voltage and generating a detection voltage proportional to the amount of cell current consumed in accordance with a result of the detection. A gap-current subtracter subtracts the consumed amount of cell current from the total amount of cell current and output a sink voltage depending upon the subtracted amount of current. A current sink discharges the dummy cell current from the output of the pump circuit in response to the sink voltage.

In an exemplary embodiment, the consuming-current detector includes a PMOS transistor connected between the output of the pump circuit and an output of the regulator. A voltage divider establishes a divisional voltage from the high voltage. A comparator generates the detection voltage from comparing the divisional voltage with a reference voltage.

In an exemplary embodiment, the current sink includes a first PMOS transistor connected between the output of the pump circuit and a subtraction node and controlled by the detection voltage. A second PMOS transistor is connected between the subtraction node and a ground voltage and is controlled by a bias voltage. A diode-coupled PMOS transistor is connected between the output of the pump circuit and the subtraction node and generates a gate voltage as the sink voltage.

In an exemplary embodiment, a current flowing through the first PMOS transistor corresponds to the cell current consumed during the programming operation, while a current flowing through the second PMOS transistor corresponds to a cell current consumed while programming all the selected memory cells.

In an exemplary embodiment, the diode-coupled PMOS transistor allows a current to flow equal to the difference between the currents flowing through the first and second PMOS transistors.

In an exemplary embodiment, the current sink includes a PMOS transistor having a source connected to the output of the pump circuit, a drain grounded through the diode-coupled NMOS transistor, and a gate coupled to respond to the sink voltage.

An exemplary embodiment of the present invention provides a method of programming a flash memory device including an array with memory cells arranged in rows and columns. A pumping voltage is generated. The pumping voltage is adjusted and a high voltage to be supplied into the array is generated. An amount of cell current consumed by selected memory cells during a programming operation, in accordance with reduction of the high voltage, is detected. A dummy cell current is discharged from an output of the pump circuit to compensate for any difference between the detected cell current and the maximum cell current.

In an exemplary embodiment, the maximum cell current corresponds to an amount of current consumed while programming all of the selected memory cells.

In an exemplary embodiment, the dummy cell current is discharged from the output of the pump circuit regardless of data to be programmed in the array.

In an exemplary embodiment, discharging the dummy cell current includes detecting the amount of cell current consumed during the programming operation in response to the reduction of the high voltage and generating a detection voltage proportional to the amount of cell current consumed in accordance with a result of the detection. The consumed amount of cell current is subtracted from the total amount of cell current and a sink voltage in proportion to the subtracted amount of current is output. The dummy cell current is discharged from the output of the pump circuit in response to the sink voltage.

Exemplary embodiments of the present invention provide a flash memory device including a main cell array having main cells arranged in rows and columns. A dummy cell array has dummy cells arranged in the rows and columns. A first write buffer drives selected memory cells of the main cell array in response to input data. A second write buffer drives selected dummy cells of the dummy cell array in response to inverse data of the input data.

Exemplary embodiments of the present invention provide a flash memory device including a main cell array having main cells arranged in rows and columns. A dummy cell array has dummy cells arranged in dummy rows and dummy columns. A first write buffer drives selected memory cells of the main cell array in response to input data. A second write buffer drives selected dummy cells of the dummy cell array in response to inverse data of the input data.

BRIEF DESCRIPTION OF THE FIGURES

The above and other features of the present disclosure will become more apparent by describing in detail exemplary embodiments of the present invention with reference to the attached drawings in which.

DETAILED DESCRIPTION OF THE EXEMPLARY EMBODIMENTS

Exemplary embodiments of the present invention are described below in more detail with reference to the accompanying drawings.

Figure 1:
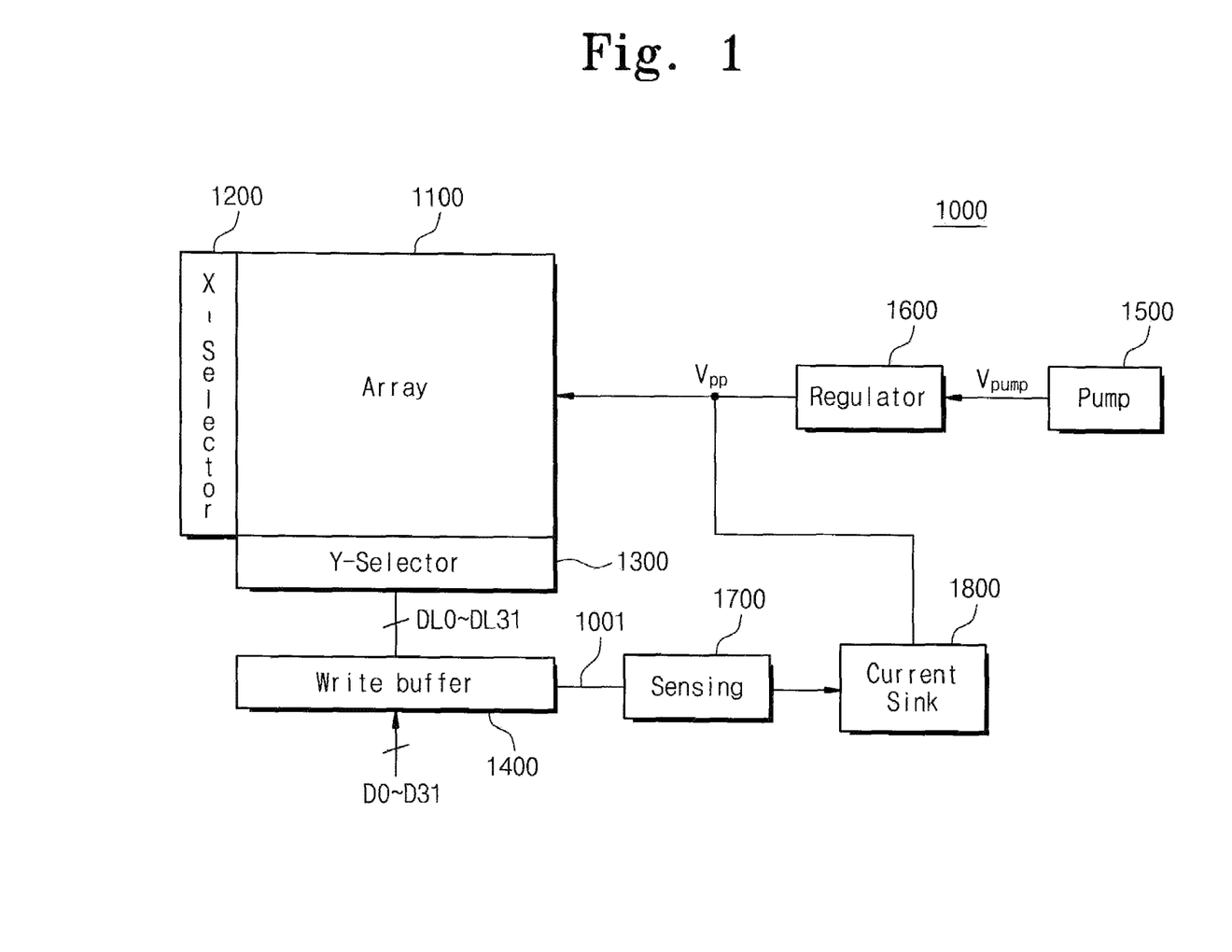
FIG. 1 is a block schematic illustrating a flash memory device in accordance with an exemplary embodiment of the present invention.

FIG. 1 is a block schematic illustrating a flash memory device in accordance with an exemplary embodiment of the present invention.

Referring to FIG. 1, the flash memory device 1000 includes a memory cell array 1100 storing N-bit data (where N is a positive integer). Although not shown, the memory cell array 1100 may be organized of memory cells arranged in rows (or word lines) and columns (or bit lines). The memory cells may be formed of, e.g., split-gate flash memory cell transistors which are erased by F-N tunneling and programmed by source-side channel hot electron injection. However, the structural configuration of the memory cells need not be limited thereto. Rows of the memory cell array 1100, for example, word lines, are selected and driven by a row selector (or X-selector) 1200. A column selector (or Y-selector) 1300 operates to select columns of the memory cell array 1100, for example, bit lines, in a predetermined unit (e.g., x32). Selected bit lines are connected to a write buffer circuit 1400. The column selector 1300 drives deselected bit lines in a power source voltage during a programming operation and in a ground voltage during an erasing/programming operation.

The write buffer circuit 1400, during the programming operation, drives bit lines, which are selected according to input data, in a program voltage or a program-inhibition voltage. For example, if input data is program data, the write buffer circuit 1400 drives a selected bit line in the program voltage (e.g., 0.3V). If input data is program-inhibited data, the write buffer circuit 1400 drives a selected bit line in the program-inhibition voltage (e.g., Vdd). The write buffer circuit 1400 may be formed of pluralities of write buffers in correspondence with an input/output bit structure. For example, if an input/output bit structure is x32, the write buffer circuit 1400 is organized with 32 write buffers. The write buffers are connected to a common sensing line 1001. Each write buffer consumes a dummy cell current when an input data bit is a program-inhibited bit. When selected memory cells (e.g., 32 memory cells) are all programmed, there is no dummy cell current dissipated through the write buffer circuit 1400. When 16 memory cells of the 32 memory cells are programmed, the write buffer circuit 1400 consumes dummy cell current proportionate to the 16 memory cells to be program-inhibited.

The flash memory device 1000 further includes a pump circuit 1500, a regulator 1600, a sensing circuit 1700, and a high-voltage current sink circuit 1800. The pump circuit 1500 generates a pumping voltage Vpump by a well-known mechanism and the regulator 1600 generates a high voltage Vpp by adjusting a level of the pumping voltage Vpump. The high voltage Vpp, although not shown herein, is supplied to a source line of a selected memory cell of the memory cell array 1100 during the programming operation. The sensing circuit 1700 is configured to supply a current to the common sensing line 1001, detecting an amount of current dissipated through the common sensing line 1001 by the write buffer circuit 1400. For example, a voltage of the common sensing line 1001 is determined by a gap between an amount of dummy cell current flowing through the write buffer circuit 1400 and an amount of sensing current supplied through the common sensing line 1001, according to the number of program-inhibited data bits. The sensing circuit 1700 generates a detection voltage Vdet1 corresponding to a detected current amount (or a sensed current gap). For example, the detection voltage Vdet1 is higher when a sensed current amount is relatively large. Accordingly, the sensing circuit 1700 operates as a current-voltage conversion circuit for transforming an amount of consumed current into a voltage. The high-voltage current sink circuit 1800 is connected to an output terminal of the regulator 1600 and consumes a current supplied from the regulator 1600 in response to the detection voltage Vdet1.

As discussed above, the flash memory device 1000 according to an exemplary embodiment of the present invention is able to maintain total current consumption at a constant level even though there is a difference between rates of currents dissipated through selected memory cells during the programming operation. For example, the flash memory device 1000 includes selected memory cells which consume the same current amount regardless of the number of data bits to be programmed.

Figure 2:
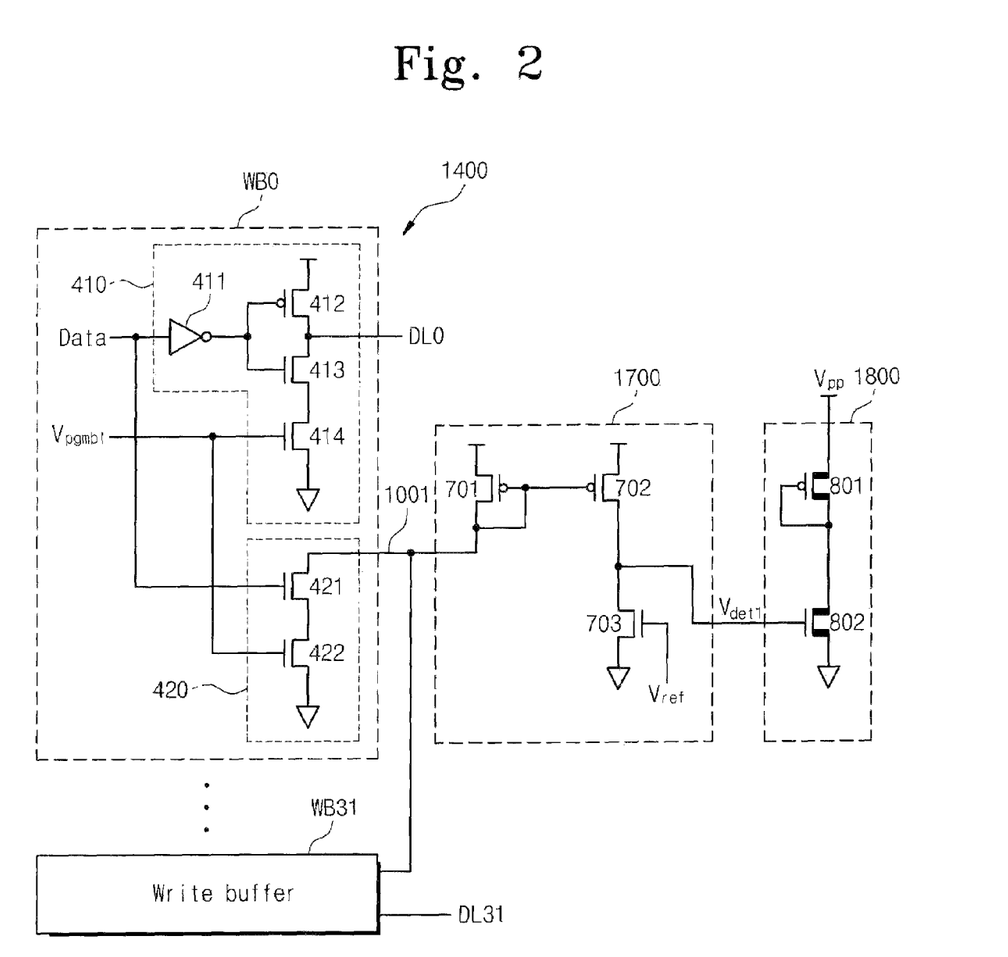
FIG. 2 is a circuit diagram illustrating a write buffer circuit, a sensing circuit, and a high-voltage current sink circuit shown in FIG. 1.

FIG. 2 is a circuit diagram illustrating the write buffer circuit 1400, the sensing circuit 1700, and the high-voltage current sink circuit 1800 shown in FIG. 1.

Referring to FIG. 2, the write buffer circuit 1400 includes pluralities of write buffers. For example, the write circuit 1400 may include 32 write buffers WB0-WB31. The write buffers WB0-WB31 are each connected to data lines DL0-DL31 respectively. For convenience of description, the write buffer WB0 will be explained in structure and operation. However, it should be understood that the remaining write buffers WB1-WB31 each have similar structures. The write buffer WB0 is comprised of a driver 410 and a current sink 420. The driver 410, as illustrated, comprises an inverter 411, a PMOS transistor 412, and NMOS transistors 413 and 414. The driver 410 operates to activate a corresponding data line DL0 in response to a bias voltage Vpgmb1. For example, the driver 410 activates the data line DL0 with the ground voltage when input data D0 is '0' in binary logic. The data line DL0 is then set on a voltage (e.g., 0.3V) higher than the ground voltage by threshold voltages of the NMOS transistors 413 and 414. Accordingly as the data line DL0 is driven with a voltage higher than the ground voltage, a memory cell connected to the data line DL0, by way of its corresponding bit line, is programmed. The driver 410 operates to drive the data Sine DL0 with the power source voltage when the input data D0 is '2' in binary logic. Accordingly, as the data line DL0 is driven with the power source voltage, a memory cell connected to the data line DL0, by way of its corresponding bit line, is program-inhibited.

The current sink 420 is comprised of NMOS transistors 421 and 422 serially connected between the common sensing line 1001 and the ground voltage. During the programming operation, the current sink 420 provides a current path from the common sensing line 1001 toward the ground voltage in accordance with the input data D0. For example, when the input data D0 is program data (data '0'), the current sink 420 does not provide a current path between the common sensing line 1001 and the ground voltage. When the input data D0 is program-inhibited data (data '1'), the current sink 420 provides a current path between the common sensing line 1001 and the ground voltage. Accordingly, a current is generated through the current path to match a current dissipated by one memory cell being programmed Hereinafter, such a current will be referred to as 'dummy cell current'.

As discussed above, each of the write buffers WB0-WB31 is configured to consume a dummy cell current when its corresponding input data is program-inhibited data.

The sensing circuit 1700 comprises gate-coupled PMOS transistors 701 and 702 and a PMOS transistor 703. The sensing circuit 1700 detects an amount of current consumed through the common sensing line 1001 and generates a detection voltage Vdet1 corresponding to the detected current amount. For example, the PMOS transistor 701 may sense an amount of current consumed while simultaneously programming 32 memory cells. Under this condition, the PMOS transistor 702 flows a current to match a difference between an amount of dummy current flowing through the write buffer by input data and an amount of current supplied through the PMOS transistor 701. A voltage across the NMOS transistor 703 is determined in proportion to the current flowing through the PMOS transistor 702, and then output as the detection voltage Vdet1. If input data bits are all program data bits, there is no dummy current consumed by each write buffer. Accordingly, the detection voltage Vdet1 becomes the ground voltage. If one of the input data bits is a program-inhibited data bit, a dummy cell current is consumed by a write buffer corresponding to the program-inhibited data bit. The current dissipated thereby, for example, a current flowing through a unit memory cell, flows through the PMOS transistor 702. A voltage across the NMOS transistor 703 is determined in proportion to the current flowing through the PMOS transistor 702, and then output as the detection voltage Vdet1. Thus, the detection voltage Vdet1 may increase along with an increase of the number of program-inhibited data bits.

The high-voltage sink circuit 1800, as shown in FIG. 2, is comprised of a PMOS transistor 801 and an NMOS transistor 802. The high-voltage current sink circuit 1800 is connected to the output of the regulator 1600 shown in FIG. 1, being configured to abstract a current from the output of the regulator 1600 in proportion to the detection voltage Vdet1. The greater the detection voltage Vdet1, the more positive current flows through the high-voltage current sink circuit 1800.

The programming operation of the flash memory device according to an exemplary embodiment of the present invention is described below in conjunction with the accompanying drawings, Beginning with the programming operation, data to be programmed (program data) into the memory cell array 1100 is transferred to the write buffer circuit 1400. The row selector 1200 operates to select one of rows of the memory cell array 1100 in response to a row address and then drives the selected row in a word line voltage (e.g., 1.2V). The column selector 1300 operates to select columns of the memory cell array 1100 in response to a column address. A high voltage generated by the regulator 1600 is supplied to a source line of selected memory cells. As discussed above, during the programming operation, deselected columns are biased on the power source voltage through the column selector 1300. Columns designated by the column selector 1300 are driven in the program voltage (e.g., 0V or a voltage higher than 0V) or the program-inhibition voltage (e.g., the power source voltage) in accordance with data provided to the write buffer circuit 1400. By this bias condition, the selected memory cells are programmed by way of source-side channel hot electron injection.

The sensing circuit 1700 operates to detect an amount of dummy cell current through the common sensing line shared by the write buffers WD0-WD31. As discussed above, each write buffer consumes the dummy cell current when input data corresponding thereto is program-inhibited data. If Input data bits are all program data bits, there is no dummy current consumed by each write buffer. Therefore, the detection voltage Vdet1 becomes the ground voltage. If one of input data bits is a program-inhibited data bit, a dummy cell current may be consumed by a write buffer corresponding to the program-inhibited data bit. The dummy current consumed thereby, for example, a current flowing through a unit memory cell, flows through the PMOS transistor 702 of the sensing circuit 1700. The voltage across the NMOS transistor 703 is determined in proportion to the current flowing through the PMOS transistor 702 and then generated as the detection voltage Vdet1. The high-voltage current sink circuit 1800 discharges a current from the output of the regulator 1600 in proportion to a level of the detection voltage Vdet1.

As can be seen from the above description, a constant current rate may be maintained regardless of the number of program data bits by consuming currents, which are to be dissipated by program-inhibited memory cells, through the sensing circuit 1700 and the high-voltage current sink circuit 1800. This constant current rate makes it more difficult for those wishing to gain unauthorized access to the stored data to estimate which data is being programmed in the flash memory device. Thus, a smart card including the flash memory device is more resistant to unauthorized access.

Figure 3:
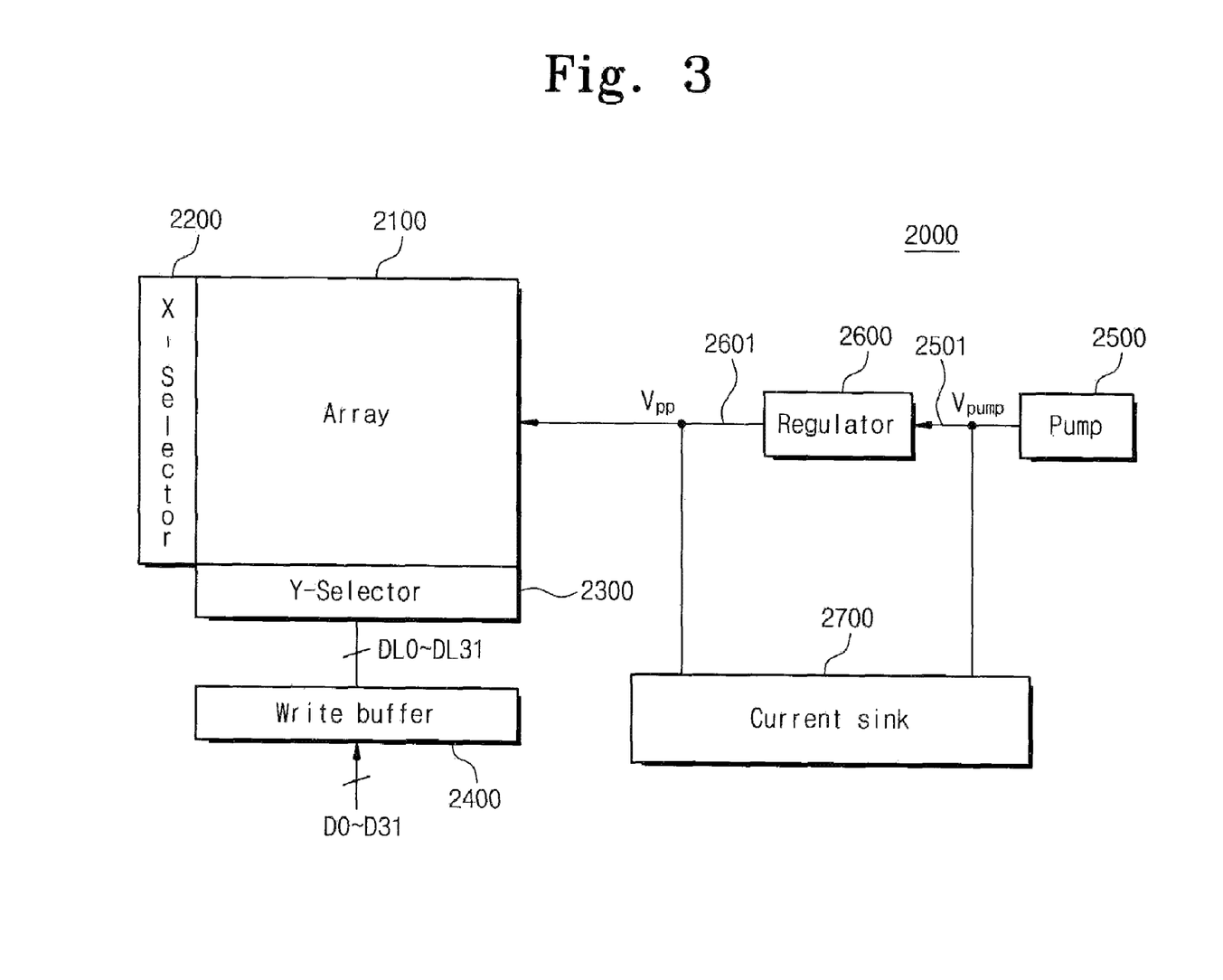
FIG. 3 is a block diagram illustrating a flash memory device in accordance with an exemplary embodiment of the present invention.

FIG. 3 is a block diagram illustrating a flash memory device in accordance with another exemplary embodiment of the present invention.

Referring to FIG. 3, the flash memory device 2000 is comprised of a memory cell array 2100, a row selector 2200, a column selector 2300, a write buffer circuit 2400, a pump circuit 2500, a regulator 2600, and a high-voltage current sink circuit 2700. In the organization of FIG. 3, the memory cell array 2100, the row selector 2200, the column selector 2300, the write buffer circuit. 2400, the pump circuit 2500, and the regulator 2600 are similar to corresponding elements shown in FIGS. 1 and 2. However, the write buffer circuit 2400 shown in FIG. 3 need not include the current sink 420 of the write buffer circuit 4000 shown in FIG. 2.

The high-voltage current sink circuit 2700 is connected to an output 2501 of the pump circuit 2500 and an output 2601 of the regulator 2600. The current sink circuit 2700 detects an amount of cell current substantially consumed in the programming operation by means of the high voltage Vpp, and then discharges a dummy cell current from the output 2501 of the pump circuit 2500 depending upon the detected result for the cell current. A current consumed while programming all of selected memory cells is referred to as 'the maximum cell current'. The high-voltage current sink circuit 2700 detects an amount of consumed cell current with reference to reduction of the high voltage Vpp and then discharges a current from the output of the pump circuit 2500 sufficient to match a difference between the maximum cell current and the detected cell current, which is described in detail below.

Figure 4:
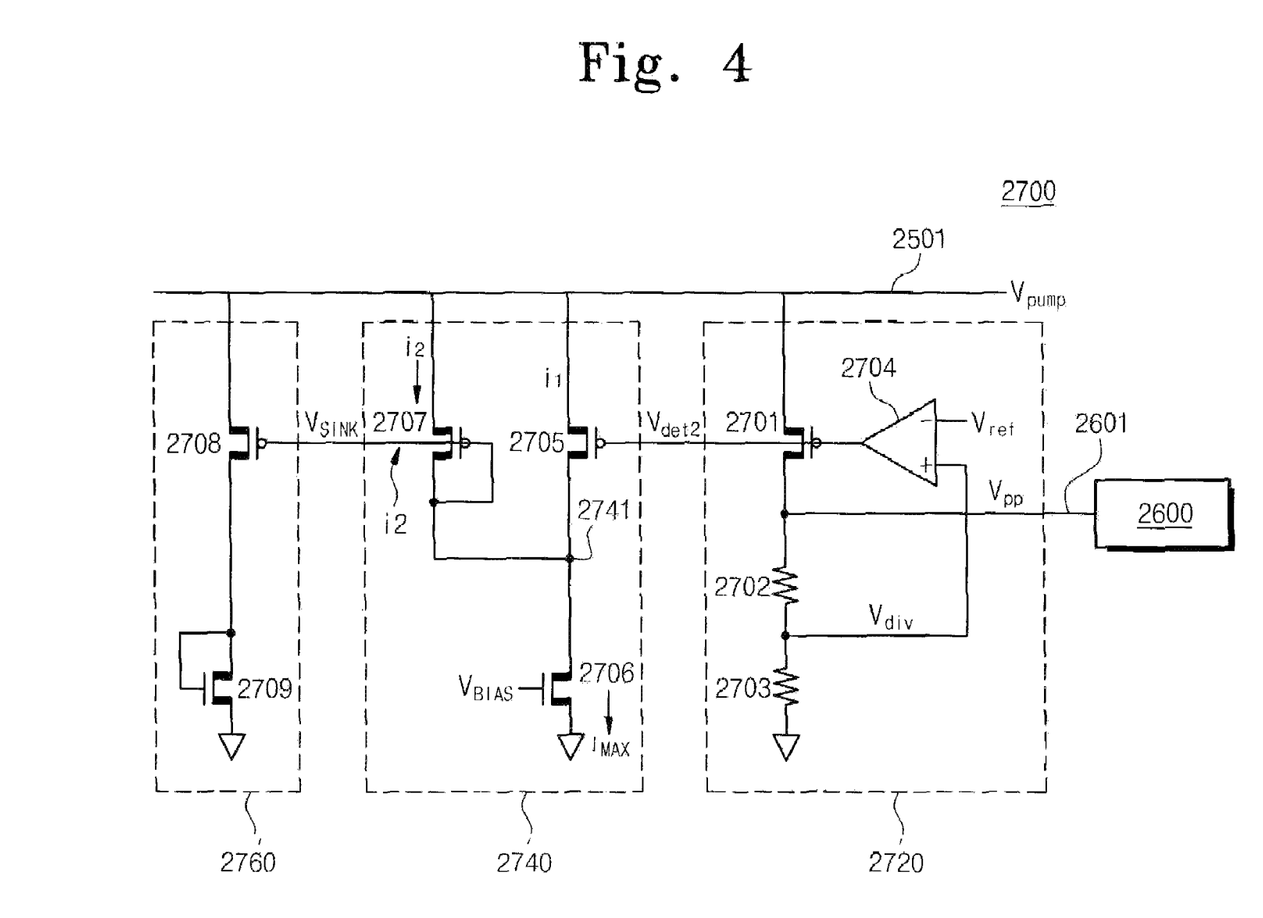
FIG. 4 is a circuit diagram illustrating a high-voltage current sink circuit shown in FIG. 3.

FIG. 4 is a circuit diagram illustrating the high-voltage current sink circuit 2700 shown in FIG. 3.

Referring to FIG. 4, the high-voltage current sink circuit 2700 is comprised of a consuming-current detector 2720, a current subtracter 2740, and a current sink 2760. The consuming-current detector 2720 is comprised of a PMOS transistor 2701, resistors 2702 and 2703, and a comparator 2704 which are coupled with each other as shown in FIG. 4. The comparator 2704 operates to compare a voltage, which is divided by the resistors 2702 and 2703, with a reference voltage. The PMOS transistor 2701 is controlled by a comparison result provided from the comparator 2704. If a programming operation begins, cell currents may be consumed in proportion to the number of program data bits. Accordingly, the high voltage Vpp is reduced. Such reduction of the high voltage Vpp causes a requirement of additional current supply from the pump circuit 2500. The additional current supply is carried out through the PMOS transistor 2701 controlled by the comparator 2704. Here, the additionally supplied current represents cell currents consumed through memory cells substantially programmed during the programming operation. Therefore, the consuming-current detector 2720 detects an amount of consumed current and then generates a detection voltage Vdet2 in proportion to an amount of current consumed by the detection result.

The current subtracter 2740 is formed of PMOS transistors 2705 and 2707 and an NMOS transistor 2706, being coupled with each other as shown in the figure. The NMOS transistor 2706 is controlled by a bias voltage Vbias. The NMOS transistor 2706 is sufficient to flow the maximum cell current $I_{MAX}$. The PMOS transistor 2705 is controlled by an output of the comparator 2704, for example, by the detection voltage Vdet2, and supplies a positive current $i_1$, which matches a current flowing through the PMOS transistor 2701, to a subtraction node 2741. Since the maximum cell current $I_{MAX}$ is discharged through the NMOS transistor 2706, the PMOS transistor 2707 supplies a current to the subtraction node 2741 as much as a difference $i_2$ between the substantially consumed cell current $i_1$ and the maximum cell current $I_{MAX}$. Thus, the current subtracter 2740 generates a sink voltage $V_{SINK}$ corresponding to the difference current $i_2$ flowing through the PMOS transistor 2707. The current sink 2760 is comprised of a PMOS transistor 2708 and an NMOS transistor 2709 which are coupled to each other as shown in FIG. 4. The current sink 2760 discharges a current from the output 2501 of the pump circuit. 2500 in response to an output of the subtracter 2740, for example, the sink voltage $V_{SINK}$. An amount of current discharged by the current sink 2760 corresponds to the difference current $i_2$ between the maximum cell current $i_{MAX}$ and the cell current substantially consumed.

The programming operation of the flash memory device according to an exemplary embodiment of the present invention is described below in conjunction with the accompanying drawings.

Beginning with the programming operation, data to be programmed (program data) into the memory cell array 2100 is transferred to the write buffer circuit 2400. The row selector 2200 operates to select one of the rows of the memory cell array 2100 in response to a row address and then drives the selected row in a word line voltage (e.g., 1.2V). The column selector 2300 operates to select columns of the memory cell array 2100 in response to a column address. A high voltage generated by the regulator 2600 is supplied to a source line of the selected memory cells. As discussed above, during the programming operation, deselected columns are biased on the power source voltage through the column selector 2300. Columns designated by the column selector 2300 are driven in the program voltage (e.g., 0V or a voltage higher than 0V) or the program-inhibition voltage (e.g., the power source voltage) in accordance with data provided to the write buffer circuit 2400. The selected memory cells are programmed by way of source-side channel hot electron injection according to the bias condition.

The high-voltage current sink circuit 2700 detects a consumed cell current in accordance with reduction of the high voltage Vpp. As a result of the detection, the high-voltage current sink circuit 2700 generates the detection voltage Vdet2 proportional to the detected cell current. The current subtracter 2740 operates in response to the detection voltage Vdet2, subtracting the substantially consumed cell current $i_1$ from the maximum cell current $i_{MAX}$. As a result of the subtraction, the current subtracter 2740 generates a subtraction voltage $V_{SINK}$ corresponding to the difference current $i_2$ between the maximum cell current $I_{MAX}$ and the cell current $i_1$ substantially consumed. The current sink 2760 discharges a current from the output 2501 of the pump circuit 2500 in response to an output of the current subtracter 2740, for example, the sink voltage $V_{SINK}$.

As can be seen from the above description, a constant current rate may be maintained regardless of the number of program data bits by consuming currents, which are to be dissipated by program-inhibited memory cells, through the high-voltage current sink circuit 2700. This constant current rate makes it difficult to estimate which data is being programmed in the flash memory device. Thus, a smart card including the flash memory device may be more secure.

Figure 5:
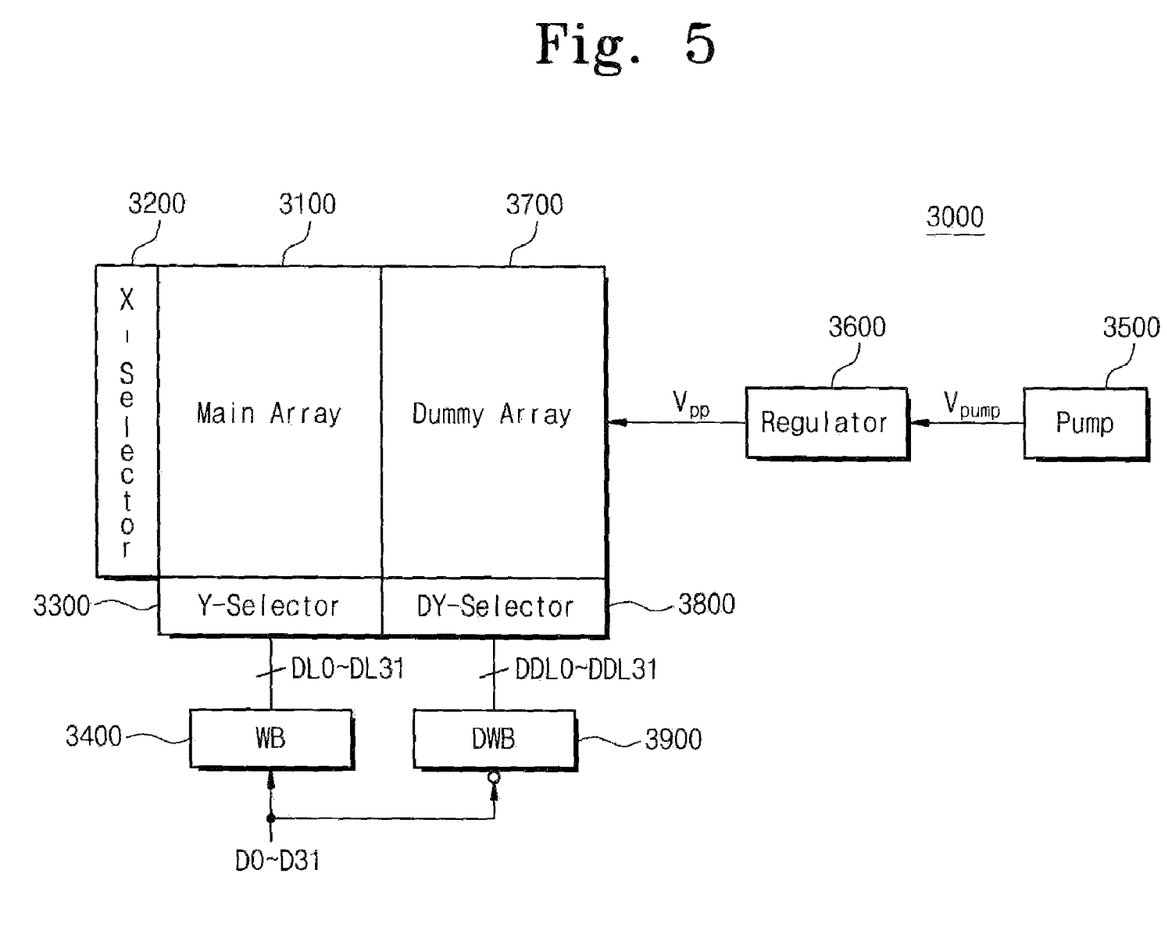
FIG. 5 is a block diagram illustrating a flash memory device in accordance with an exemplary embodiment of the present invention.
Figure 6:
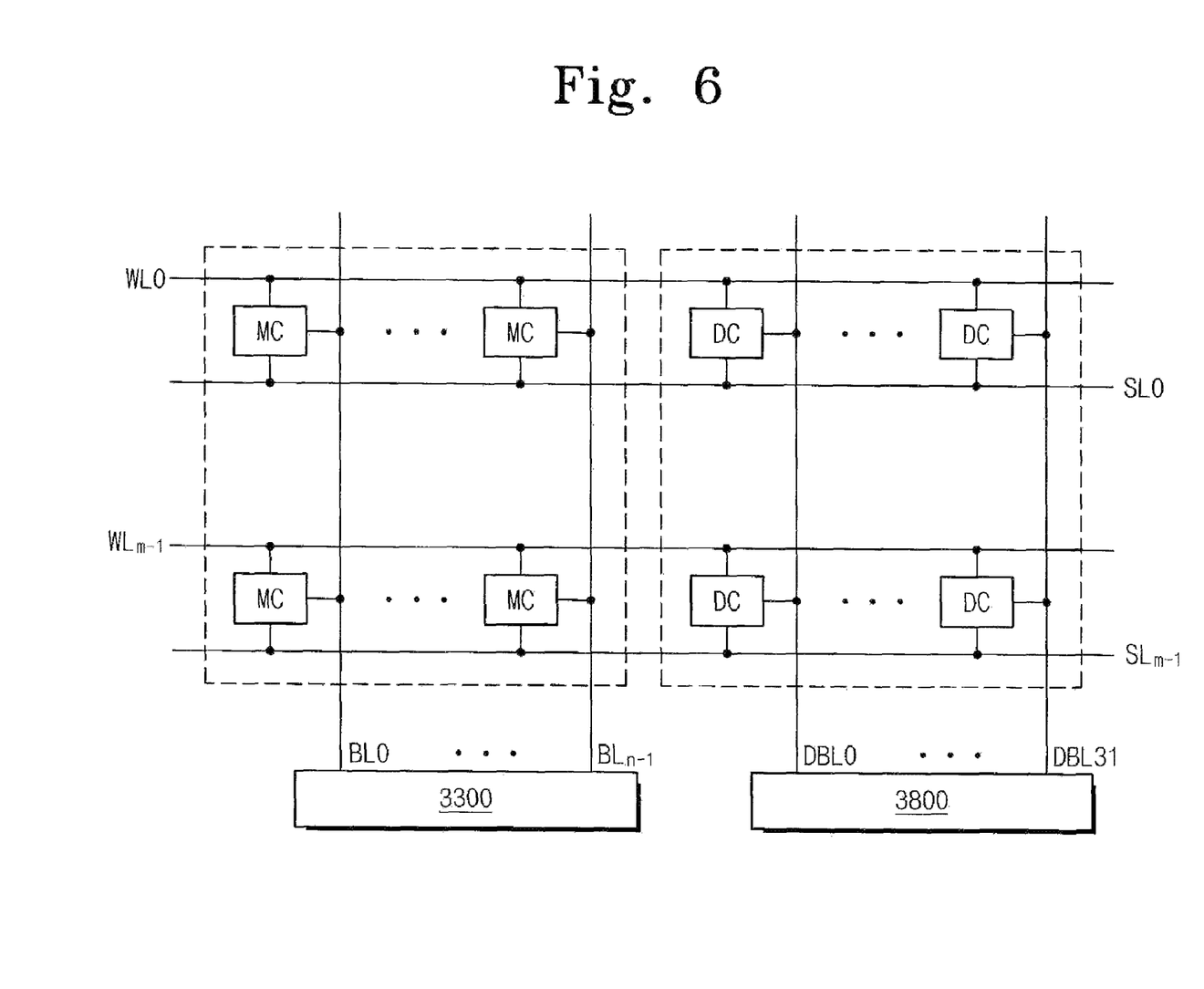
FIG. 6 is a block diagram illustrating main and dummy cell arrays shown in FIG. 5.

FIG. 5 is a block diagram illustrating a flash memory device in accordance with another exemplary embodiment of the present invention. FIG. 6 is a block diagram illustrating main and dummy cell arrays 3100 and 3700 shown in FIG. 5.

Referring first to FIG. 5, the flash memory device 3000 is comprised of a memory cell array 3100, a row selector 3200, a column selector 3300, a write buffer circuit 3400, a pump circuit 3500, and a regulator 3600. In FIG. 5, the memory cell array 3100, the row selector 3200, the column selector 3300, the write buffer circuit 3400, the pump circuit 3500, and the regulator 3600 are substantially similar to the corresponding elements shown in FIG. 3.

As illustrated in FIG. 5, the flash memory device may further include a dummy cell array 3700, a dummy column selector (DY-selector) 3800, and a dummy write buffer (DWB) circuit 3900. The dummy cell array 3700 may have the same structure as the main cell array 3100. For example, as shown in FIG. 6, the dummy cell array 3700 is structured to share the rows (including word and source lines) with the main cell array 3100, including dummy bit lines DBL0-DBL31 corresponding to the number of memory cells, e.g., 32, programmed at the same time. The dummy column selector 3800 connects the dummy bit lines DBL0-DBL31 with dummy data lines DDL0-DDL31 corresponding thereto during a programming operation. The dummy column selector 3800 may comprise switches, each connected between the dummy bit lines DBL0-DBL31 and the dummy data lines DDL0-DDL3. Alternatively, the dummy bit lines DBL0-DBL31 may be directly connected to the dummy data lines DDL0-DDL31. The dummy write buffer circuit 3900 drives the dummy bit lines DBL0-DBL31 in the program voltage (e.g., the ground voltage or a voltage higher than the ground voltage) or the program-inhibition voltage (e.g., the power source voltage) in response to inverse data of input data. The write buffer circuits, 3400 and 3900, may have a similar structure as the write buffer shown in FIG. 2 but for the current sink 420.

In the flash memory device 300, the dummy write buffer 3900 is supplied with inverse data of the input data D0-D31. For example, if a program data bit is input into a unit write buffer, selected memory cells of the main cell array 3100 are programmed. In this case, the dummy write buffer is supplied with a program-inhibited data bit, and a selected dummy cell of the dummy cell array 3700 is inhibited in programming. If, however, a program-inhibited data bit is input into a unit write buffer, selected main cells of the main cell array 3100 are inhibited in programming. In this case, the dummy write buffer is supplied with a program data bit, and a selected dummy cell of the dummy cell array 3700 is programmed thereby. Thus, cell currents to be dissipated by program-inhibited main cells are consumed through the dummy cell array 3700. As a result, a constant cell current is normally consumed regardless of the number of program data bits input thereto.

As can be seen from the above description, such a constant current rate regardless of the number of program data bits makes it difficult to estimate which data is being programmed in the flash memory device. Thus, a smart card including the flash memory device is more secure.

Figure 7:
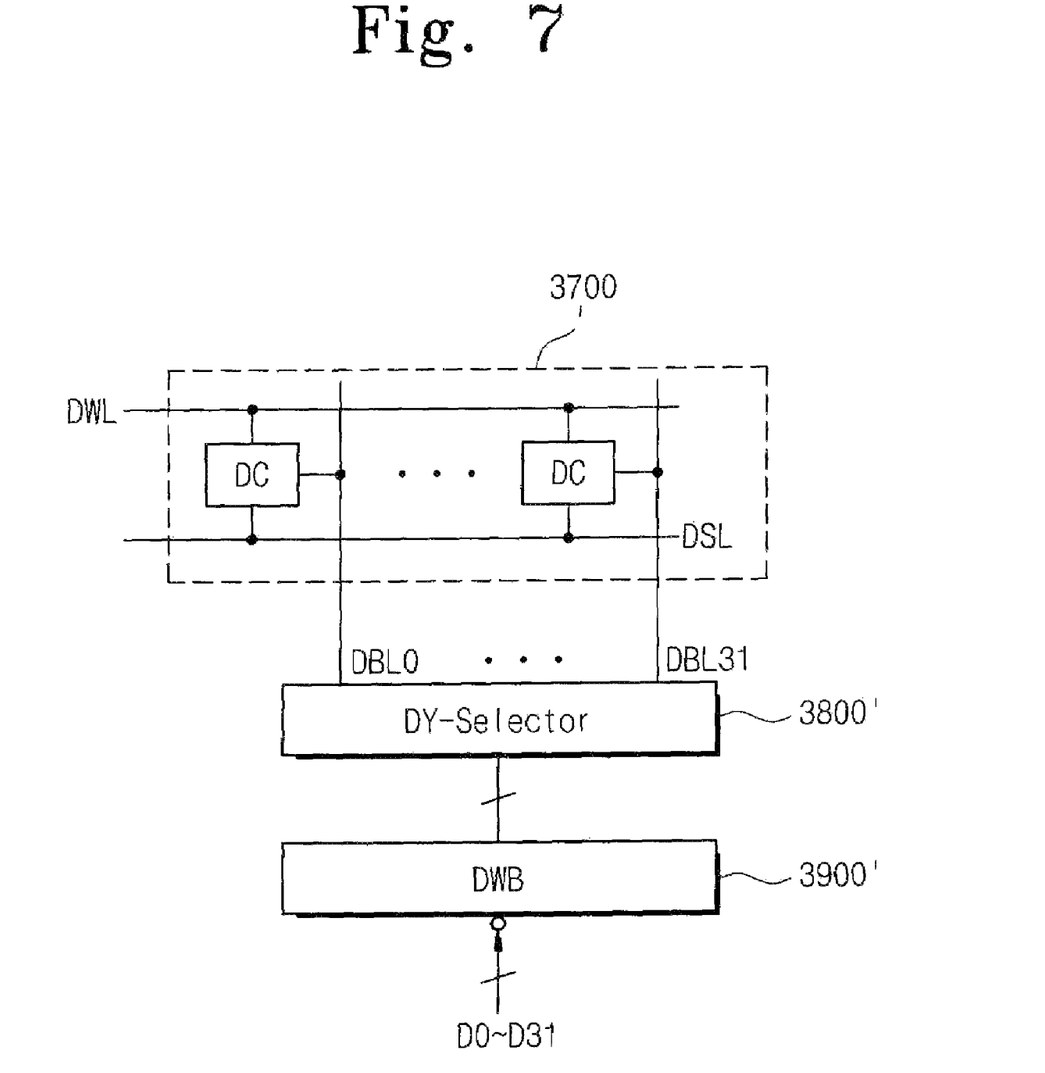
FIG. 7 is a block diagram illustrating an exemplary embodiment of the dummy cell array shown in FIG. 5.

The dummy cell array may vary from the pattern shown in FIG. 6. For example, as illustrated in FIG. 7, another dummy cell array 3700' is composed of dummy cells arranged in a single row (including a word line and a source line) and pluralities of bit lines, e.g., 32 in number, DBL0-DBL31. In this case, the word line DWL and the source line DSL, of the dummy cell array 3700' are each driven with correspondent voltages only during the programming operation. Except for this feature, the dummy cell array 3700', a dummy column selector 3800', and a dummy write buffer circuit 3900' are substantially similar to the corresponding elements shown in FIG. 5.

Figure 8:
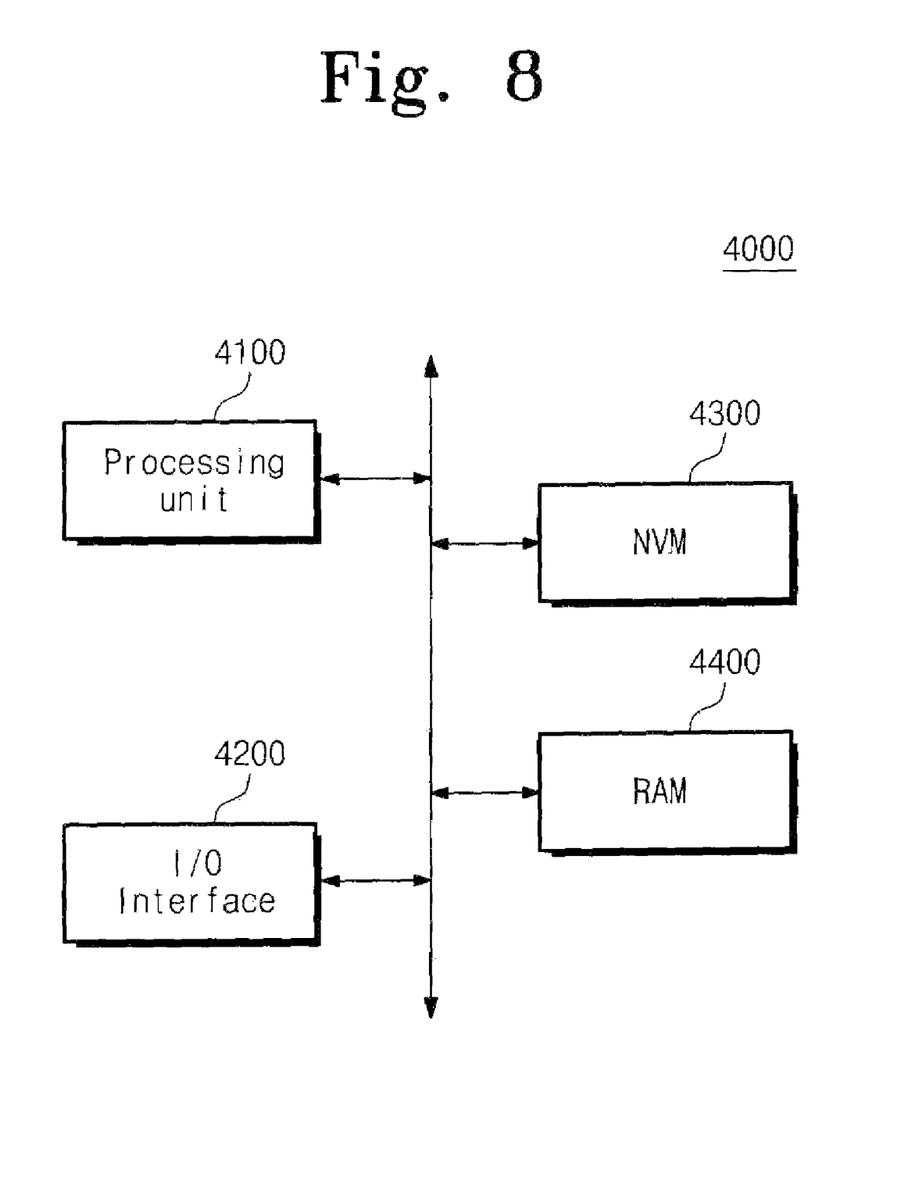
FIG. 8 is a block schematic illustrating a smart card including a flash memory device according to exemplary embodiments of the present invention.

FIG. 8 is a block schematic illustrating a smart, card including a flash memory device according to exemplary embodiments of the present invention.

Referring to FIG 8, the smart card 4000 includes a processing unit 4100, for example, a central processing unit or a microprocessor, an input/output (I/O) interface 4200 for (wired and/or wireless) communication with an external system (e.g., a card reader), a nonvolatile memory device (NVM) 4300 used as a data or program memory unit, and a random access memory (RAM) 4400. The nonvolatile memory device 4300 is substantially similar to the corresponding elements shown in FIGS. 1, 3, 5, and 7. Although not shown, the smart card 4000 may further include an encryption and decryption processing unit, an error correction unit, a hacking-protection security sensing unit, a memory management unit, and so on.

As described above, by maintaining a cell current at a constant rate during a programming operation in a flash memory device, it is difficult to circumvent security protections by estimating which data is being programmed in the flash memory device.

While the present disclosure has been particularly shown and described with reference to exemplary embodiments of the present invention, it will be understood by those of ordinary skill in the art that various changes in form and details may be made without departing from the spirit and scope of the present invention.

What is claimed is:

1. A flash memory device comprising:
   an array having memory cells arranged in rows and columns;
   a high voltage generator configured to supply a high voltage to the array during a programming operation;
   a plurality of write buffers corresponding to selected memory cells and being configured to drive the selected memory cells with one of a program voltage or a program-inhibition voltage depending upon input data, each write buffer being configured to consume a dummy cell current when the input data is program-inhibited data;
   a current-voltage conversion circuit connected to each of the plurality of write buffers through a common sensing line, supplying a current to the plurality of write buffers as the dummy cell current through the common sensing line and outputting a voltage proportional to the current supplied to the plurality of write buffers; and
   a current sink circuit configured to discharge a current from an output of the high voltage generator in response to a voltage output from the current-voltage conversion circuit.

2. The flash memory device as set forth in claim 1, wherein each of the plurality of write buffers comprises:
   a drive circuit configured to drive a corresponding memory cell in response to corresponding input data during the programming operation; and
   a current sink configured to discharge the dummy cell current from the common sensing line in response to the corresponding input data during the programming operation.

3. The flash memory device as set forth in claim 2, wherein the dummy cell current consumed through the current sink of the plurality of write buffers corresponds to a cell current consumed through a unit memory cell during the programming operation.

4. The flash memory device as set forth in claim 1, wherein the current-voltage conversion circuit is configured to supply a current, equal to a current consumed while programming the selected memory cells, to the common sensing line.

5. The flash memory device as set forth in claim 1, wherein a sum of an amount of current consumed while programming the selected memory cells and an amount of current consumed by the plurality of write buffers remains constant for any number of program data bits in the input data.

6. The flash memory device as set forth in claim 1, wherein the array is arranged in a smart card.

7. A method of programming a flash memory device including: an array having memory cells arranged in rows and columns; a high voltage generator configured to supply a high voltage to the array during a programming operation; and a plurality of write buffers configured to drive selected memory cells with one of a program voltage or a program-inhibition voltage depending upon input data, the method comprising:
   driving the selected memory cells with one of the program voltage or the program-inhibition voltage depending upon the input data and consuming a dummy cell current through each of the plurality of write buffers when the input data is program-inhibited data;
   outputting a voltage proportional to a current supplied to the plurality of write buffers as the dummy cell current through a common sensing line shared by the plurality of write buffers; and
   discharging a current from an output of the high voltage generator depending upon a voltage proportional to the current supplied to the plurality of write buffers.

8. The method as set forth in claim 7, wherein a sum of an amount of current consumed while programming the selected memory cells and an amount of current consumed by the plurality of write buffers remains constant for any number of program data bits in the input data.

* * * * *